(12) United States Patent
Kamatani

(10) Patent No.: US 8,248,140 B2
(45) Date of Patent: Aug. 21, 2012

(54) SEMICONDUCTOR DEVICE FOR DETECTING POWER SUPPLY VOLTAGE

(75) Inventor: Tomohiko Kamatani, Kawanishi (JP)

(73) Assignee: Ricoh Company, Ltd., Tokyo (JP)

( * ) Notice: Subject to any disclaimer, the term of this patent is extended or adjusted under 35 U.S.C. 154(b) by 77 days.

(21) Appl. No.: 12/877,575

(22) Filed: Sep. 8, 2010

(65) Prior Publication Data

US 2011/0057703 A1 Mar. 10, 2011

(30) Foreign Application Priority Data

Sep. 10, 2009 (JP) ................................. 2009-209486

(51) Int. Cl.
*H03L 5/00* (2006.01)
(52) U.S. Cl. ........ 327/306; 327/142; 327/143; 327/198; 372/38.02; 372/38.04
(58) Field of Classification Search .................. 327/143, 327/198, 306; 372/38.02, 38.04
See application file for complete search history.

(56) References Cited

U.S. PATENT DOCUMENTS

2008/0297211 A1* 12/2008 Shim ............................. 327/143

FOREIGN PATENT DOCUMENTS

| JP | 11-16395 | 1/1999 |
|---|---|---|
| JP | 2002-354793 | 12/2002 |
| JP | 2003-78202 | 3/2003 |
| JP | 2006-313917 | 11/2006 |
| JP | 2007-73543 | 3/2007 |
| JP | 2007-210238 | 8/2007 |
| JP | 4225451 | 12/2008 |

\* cited by examiner

*Primary Examiner* — John Poos
(74) *Attorney, Agent, or Firm* — Cooper & Dunham LLP

(57) ABSTRACT

A semiconductor device includes an internal circuit to perform a predetermined function at a plurality of different supply power voltages, a power supply voltage region detector to detect a supply power voltage to output a detection signal, a latch to store the signal output from the power supply voltage region detector and output the stored signal as a power supply voltage region signal, and a reset circuit to generate a reset signal to perform a predetermined reset operation on the internal circuit. The latch stores the output signal from the power supply voltage region detector just after the reset operation for the internal circuit is released, and the internal circuit changes an internal setting according to the power supply voltage region signal output from the latch.

10 Claims, 8 Drawing Sheets

SEMICONDUCTOR DEVICE FOR DETECTING POWER SUPPLY VOLTAGE

TECHNICAL FIELD

The present disclosure relates to a semiconductor device, and more particularly, to a semiconductor device capable of operating with the best bias condition under any power supply voltage.

BACKGROUND ART

Recently, with increasing demand for portable electronic devices such as mobile phones, there is a concomitant need for high performance semiconductor devices to power such portable equipment. In connection with rapid progress in fine-process technology in semiconductor processing, it has become possible to manufacture extremely fine, dense internal circuitry. Accordingly, a lower operating voltage must be supplied to the circuits manufactured with the fine process, especially with the central processing unit (CPU). For example, the CPU circuits of previous generations are designed to be operated at 5 v±5%. By contrast, the CPU circuits of the current generation are designed to be operated at 3.3 v±5%. Further, the CPU circuits of the coming generation will have to operate at 2.5 v±5%.

If all peripheral circuits employed together with such CPU are developed to operate at the same operating voltage as that for the CPU, it needs relatively long term to develop the system. Further, the advantages of mass production are reduced, resulting in a cost penalty.

If peripheral devices which can operate at both 5 v±5% and 3.3 v±5% are developed, it is possible to shorten development time and achieve cost reduction owing to the advantages of mass production.

Further, when a laser diode drive circuit is included in the semiconductor device, the laser diode drive circuit is requested to operate under a wide supply voltage because the drive voltage of the laser diode differs according to the emission wavelength of the laser diode.

To satisfy such demand, JP-2003-78202-A describes a laser diode drive circuit that includes a plurality of supply voltage sources to generate a plurality of voltages to drive a plurality of laser diodes each of which needs a different drive voltage, a supply voltage source exchange unit, a current amplifier, and a laser diode exchange unit. The supply voltage source exchange unit switches the supply voltage source to supply the appropriate drive voltage to the laser diode to be driven. The current amplifier supplies the current to the laser diode. The laser diode exchange unit switches the laser diode to obtain the supply current to the laser diode. Accordingly, the circuit elements of the current amplifier are provided to each of the respective laser diodes independently.

FIG. 1 is a circuit diagram of a known semiconductor device. The semiconductor device 100 includes an internal circuit 101 and a reset circuit 102. The internal circuit 101 performs a predetermined function. The reset circuit 102 generates a reset signal RES that puts the internal circuit 101 in a predetermined reset state. The electronic circuit in the semiconductor device 100 is designed to operate under a predetermined power supply voltage range, for example, 5 v±5%, and 3.3 v±5%. Accordingly, if the power supply voltage exceeds the power supply voltage range for the design basis, it is not possible for the circuit to provide maximum performance. Further, if a high voltage much higher than the predetermined power supply voltage range is applied, the semiconductor device might fail.

If the circuit is designed to operate at a low operating voltage with high voltage transistors, it may be able to operate over a wide supply voltage range between a low voltage region and a high voltage region. However, such circuit does not operate optimally under both high voltage conditions and low voltage conditions.

For example, FIG. 2 is a circuit diagram of a known supply voltage drop detection circuit provided in the internal circuit to protect the semiconductor device and display an alarm when the supply voltage drops. The supply voltage drop detection circuit of FIG. 2 includes a comparator 121, bleeder resistors R121 and R122, and a reference voltage source 123 that generates a predetermined reference voltage VrB. In the supply voltage drop detection circuit of FIG. 2, a supply voltage VA or VB is input to a power supply voltage terminal Vdd. The supply voltage VA or VB is divided by the bleeder resistors R121 and R122 to input a divided voltage Vin to the comparator 121. The comparator 121 compares the divided voltage Vin and the reference voltage VrB. If the divided voltage Vin is higher than the reference voltage VrB, the comparator 121 output is high. If the divided voltage Vin is equal to or lower than the reference voltage VrB, the comparator 121 output is low. Thus, the output signal of the comparator 121 is a voltage drop detection signal.

FIGS. 3 and 4 are timing charts representing an example operation of the circuit of FIG. 2. FIG. 3 represents a case in which the low power supply voltage VB is input to the power supply voltage terminal Vdd. FIG. 4 represents a case in which the high power supply voltage VA is input to the power supply voltage terminal Vdd. A reference voltage VrA is a voltage value of the divided voltage Vin to detect a voltage drop when the power supply voltage is VA. A voltage VrB is a voltage value of the divided voltage Vin to detect a voltage drop when the power supply voltage is VB.

In FIG. 3, when the power supply voltage VB is decreased and the divided voltage Vin becomes lower than the reference voltage VrB, the comparator 121 outputs a low level signal as the voltage drop detection signal.

However, in FIG. 4, when the power supply voltage VA is decreased and the divided voltage Vin becomes lower than the reference voltage VrA, the comparator 121 does not invert the output signal, and does not output the voltage drop detection signal until the divided voltage Vin drops to the reference voltage VrB. This is because the circuit is set so that the voltage VrB is used as the reference voltage and optimized for a case of the low power supply voltage VB.

Conversely, if the reference voltage is set to the voltage VrA, the voltage drop detection signal continues to be output when the power supply voltage VB is used. Accordingly, it is not possible to set the voltage VrA as the reference voltage. Thus, when the supply voltage is the high power supply voltage VA, it is not possible to detect at a desired voltage, resulting in degeneration in accuracy of detection of the supply voltage drop.

FIG. 5 is a circuit diagram of a known terminal voltage detection circuit which outputs a terminal voltage detection signal when a voltage input to an external terminal T1 of the semiconductor provided in the internal circuit 101 becomes equal to or higher than a predetermined voltage. FIG. 6 is a timing chart representing an example operation of the circuit of FIG. 5. In FIG. 6, Vin+ is a voltage value of the divided voltage Vin when the power supply voltage VA or VB swings fully towards the upper limit. In FIG. 6, Vin− is a voltage value of the divided voltage Vin when the power supply voltage VA or VB swings fully towards the lower limit. In the terminal voltage detection circuit of FIG. 5, a comparator 122 compares a divided voltage Vin obtained by dividing the supply voltage VA or VB by the bleeder resistors R123 and R124 with a divided voltage VT1 obtained by dividing the voltage input to an external terminal T1 by the bleeder resistors R125 and R126. Accordingly, the output signal of the comparator 122 is a terminal voltage detection signal.

When the voltage VT1 is higher than the divided voltage Vin, a terminal voltage detection signal becomes high. When the voltage VT1 is lower than the divided voltage Vin, the terminal voltage detection signal becomes low.

However, the power supply voltage VA or VB varies within a predetermined voltage range. Accordingly, a pulse width of the terminal voltage detection signal changes significantly between a state in which the divided voltage Vin is Vin+ and a state in which the divided voltage Vin is Vin−. Accordingly, it may not be possible to detect the voltage at the external terminal T1 accurately.

FIG. 7 is a circuit diagram of known bias circuit which is used, for example, in an amplifier circuit provided in the internal circuit 101. In FIG. 7, a PMOS transistor M132 is provided and a predetermined bias voltage is input to a gate of the PMOS transistor M132 to eliminate a fluctuation of the drain voltage of the PMOS transistor M131 due to a fluctuation of the supply voltage input to the power supply terminal Vdd. However, the bias voltage is set to an intermediate voltage to operate both under the power supply voltages VA and VB. Consequently, the bias voltage can not be the best bias condition for each power supply voltage VA and VB.

FIG. 8 represents a switching transistor and drive circuit. As shown in FIG. 8, a switching transistor is formed of a lot of small size transistors connected in parallel, each transistor has a predetermined general size.

More specifically, in FIG. 8, the switch transistor is formed of PMOS transistors M141 through M144. An output terminal of a buffer circuit 141 having a large driving power is connected to each gate of the PMOS transistors M141 through M144. A buffer circuit 142 having a small driving power is connected to an input terminal of the buffer circuit 141.

When the power supply voltage is low, the operational voltage range is narrow. For this reason, it is necessary to make the switching transistor large in size. In the prior circuit, the number of transistors connected in parallel is increased to obtain a large switching transistor. However, if the number of transistors is increased, it may exceed a necessary performance, i.e., over-specification, and a parasitic capacitance of the switching transistor is increased. A switching transistor that switches at high speed generates a large noise when the power supply voltage is high and the parasitic capacitance is large. Accordingly, if the number of transistors is increased to fit for a condition when the power supply voltage is low, a large noise may be generated when the circuit operates under a high power supply voltage.

Further, in a semiconductor that includes a known laser drive circuit in the internal circuit 101, as described previously each laser diode needs a different drive voltage. Accordingly, an appropriate laser drive circuit is connected to each laser diode by switching the connection to the laser drive circuits to supply power to laser drive. Thus, it is necessary to prepare a circuit dedicated to extra laser diodes that are not used, resulting in a cost penalty.

SUMMARY

This patent specification describes a novel semiconductor device that includes an internal circuit to perform a predetermined function at a plurality of different supply power voltages, a power supply voltage region detector to detect a supply power voltage to output a detection signal, a latch to store the signal output from the power supply voltage region detector and output the stored signal as a power supply voltage region signal, and a reset circuit to generate a reset signal to perform a predetermined reset operation on the internal circuit. The latch stores the output signal from the power supply voltage region detector just after the reset operation for the internal circuit is released, and the internal circuit changes an internal setting according to the power supply voltage region signal output from the latch.

This patent specification further describes a novel semiconductor device that includes an internal circuit which includes an automatic power control (APC) drive circuit that performs drive control for the laser diode, a power supply voltage region detector configured to detect a supply power voltage to output a detection signal, a latch configured to store the output signal from the power supply voltage region detector and output the stored signal as a power supply voltage region signal, and a reset circuit configured to generate a reset signal to cause the internal circuit to perform a predetermined reset operation. The latch stores the signal output from the power supply voltage region detector by the first APC signal after power-on, which causes the APC drive circuit to operate, and the internal circuit changes an internal setting according to the power supply voltage region signal output from the latch.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
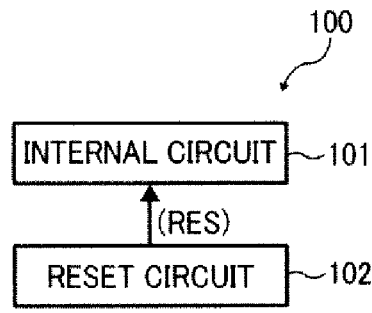
FIG. 1 is a circuit diagram of a known semiconductor device.
Figure 2:
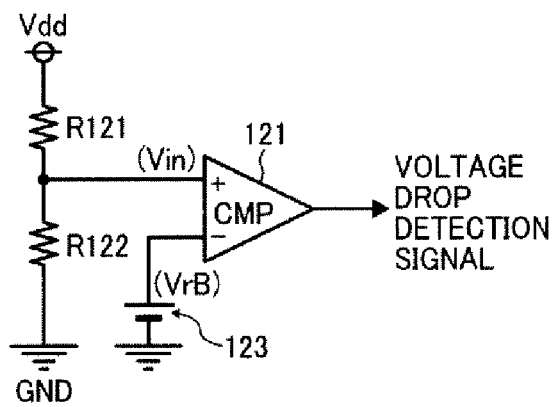
FIG. 2 is a circuit diagram of an example known supply voltage drop detection circuit provided in the internal circuit.
Figure 3:
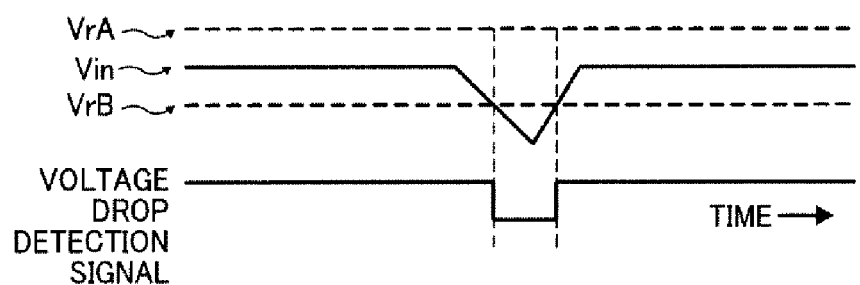
FIGS. 3 and 4 are timing charts representing an example operation of the circuit of FIG. 2.
Figure 4:
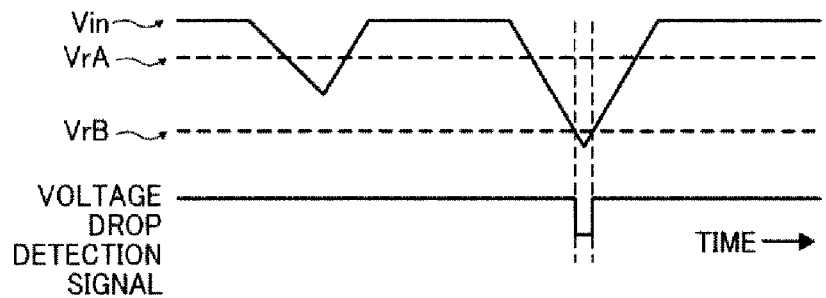
Figure 5:
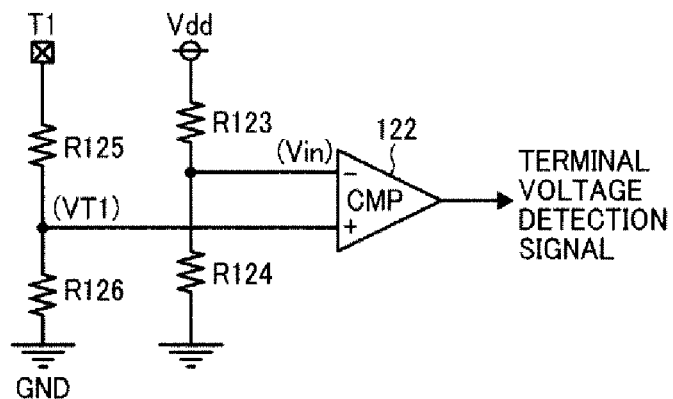
FIG. 5 is a circuit diagram of a known terminal voltage detection circuit provided in the internal circuit.
Figure 6:
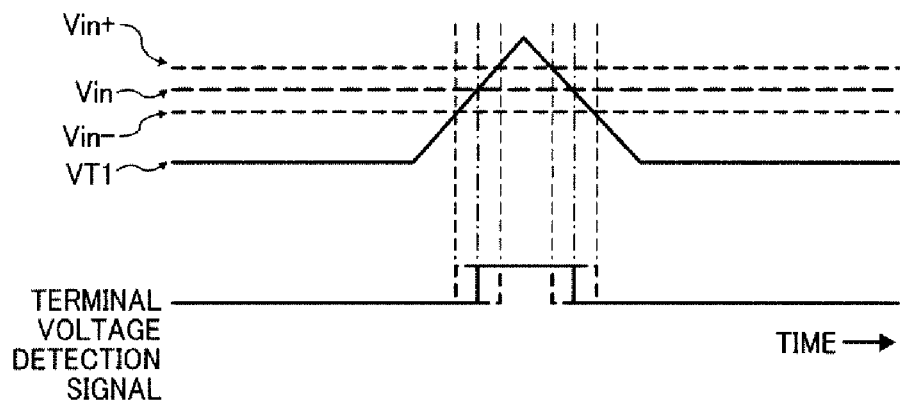
FIG. 6 is a timing chart representing an example operation of the circuit of FIG. 5.
Figure 7:
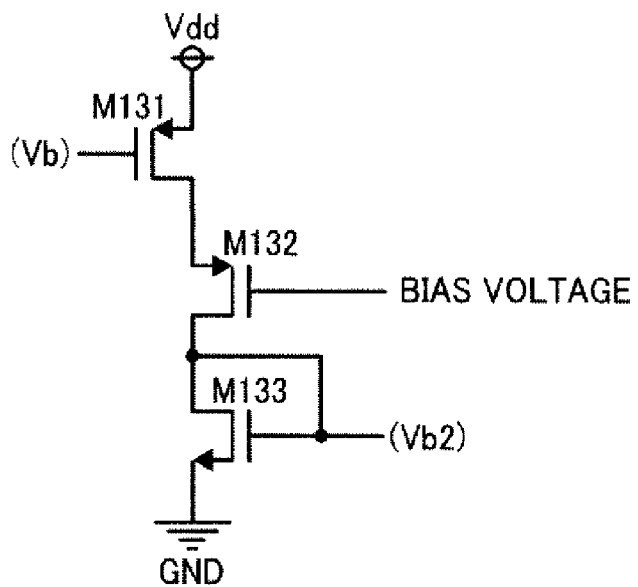
FIG. 7 is a circuit diagram of a known bias circuit provided in the internal circuit.
Figure 8:
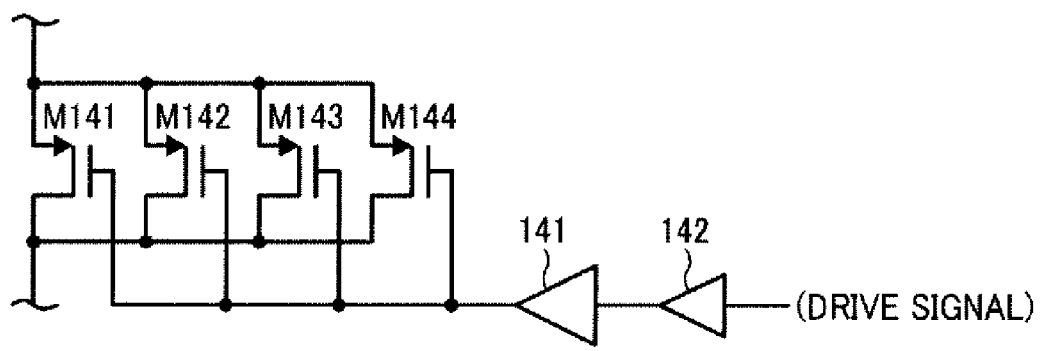
FIG. 8 is a circuit diagram of a known switch transistor provided in the internal circuit.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Figure 9:
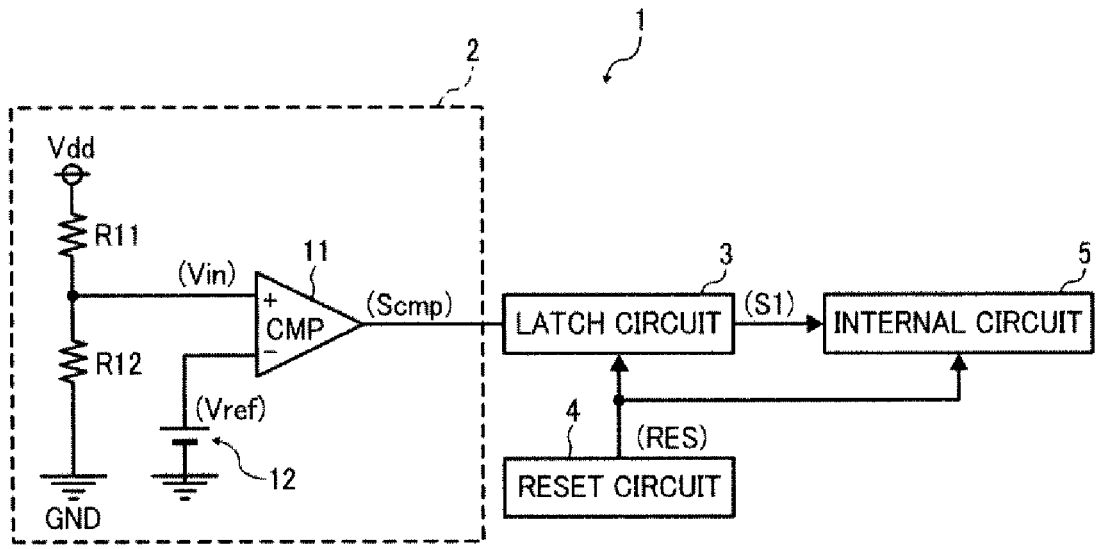
FIG. 9 is a block diagram of a semiconductor device according to an illustrative first embodiment.

Referring now to the drawings, wherein like reference numerals designate identical or corresponding parts throughout the several views, particularly to FIG. 9, a semiconductor device according to an illustrative embodiment is described.

FIG. 9 is a block diagram of a semiconductor device according to an illustrative first embodiment. The semiconductor device 1 includes a power supply voltage region detector 2, a latch circuit 3 (hereinafter also simply "latch 3"), a reset circuit 4, and an internal circuit 5.

The power supply voltage region detector 2 includes a comparator 11, bleeder resistors R11 and R12, and a reference voltage generator 12. The reference voltage generator 12 generates a predetermined reference voltage Vref. The resistors R11 and R12 are connected in series between a power supply terminal Vdd and ground GND.

The latch 3 stores an output signal Scmp output from the comparator 11 at a falling edge of the reset signal RES output from the reset circuit 4, and outputs the signal to the internal circuit 5 as a power supply voltage region signal S1.

The reset circuit 4 outputs a reset signal RES to initialize the internal circuit 5 when power is supplied to the semiconductor device 1.

The internal circuit 5 is an electronic circuit provided in the semiconductor device 1 to perform a predetermined function.

Figure 10:
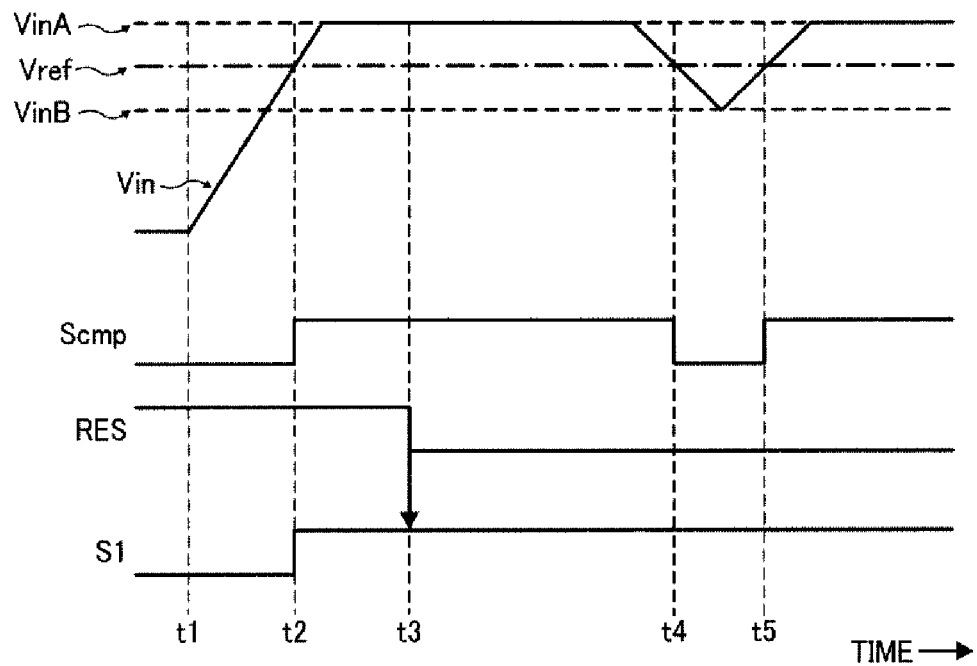
FIG. 10 is a timing chart representing an example operation of the semiconductor device of FIG. 9.

FIG. 10 is a timing chart representing an example operation of the semiconductor device 1 of FIG. 9.

In FIG. 10, a voltage VinA is a voltage of the divided voltage Vin when the power supply voltage VA, that is a high voltage, is input to the power supply terminal Vdd. A voltage VinB is a voltage of the divided voltage Vin when the power supply voltage VB, which is a low voltage, is input to the power supply terminal Vdd. A reference voltage Vref is set to around an intermediate voltage roughly halfway between the voltages VinA and VinB. Further, FIG. 10 represents a case where the power supply voltage VA is input to the power supply terminal Vdd.

At time t1 in FIG. 10, power is applied to the semiconductor 1. Then, the divided voltage Vin is increased in proportion to an increase of the power supply voltage. Further, at time t2, when the divided voltage Vin exceeds the reference voltage Vref, the output signal Scmp of the comparator 11 is inverted to a high level. Further, at time t3, when a reset signal RES is changed from a high level to a low level, the latch 3 and the internal circuit 5 complete the reset operation. The latch 3 stores a signal level of the output signal Scmp of the comparator 11 at the time t3, and outputs the signal to the internal circuit 5 as a power supply voltage region signal S1.

As described, at the time t3 of FIG. 10, the signal level of the power supply voltage region signal S1 is stored in the latch 3. Accordingly, for example, during a period between time t4 and time t5, even when the power supply voltage is decreased, the divided voltage Vin falls below the reference voltage Vref, and the output signal Scomp of the comparator 11 becomes a low level, the signal level of the power supply voltage region signal S1 is not changed.

In the previous explanation, a case in which the power supply voltage is the high voltage VA is explained. In contrast, in a case in which the low power supply voltage VB is input to the semiconductor device 1 is input, the signal level is reversed. Further, the internal circuit 5 changes the internal setting according to the signal level of the power supply voltage region signal S1.

Figure 11:
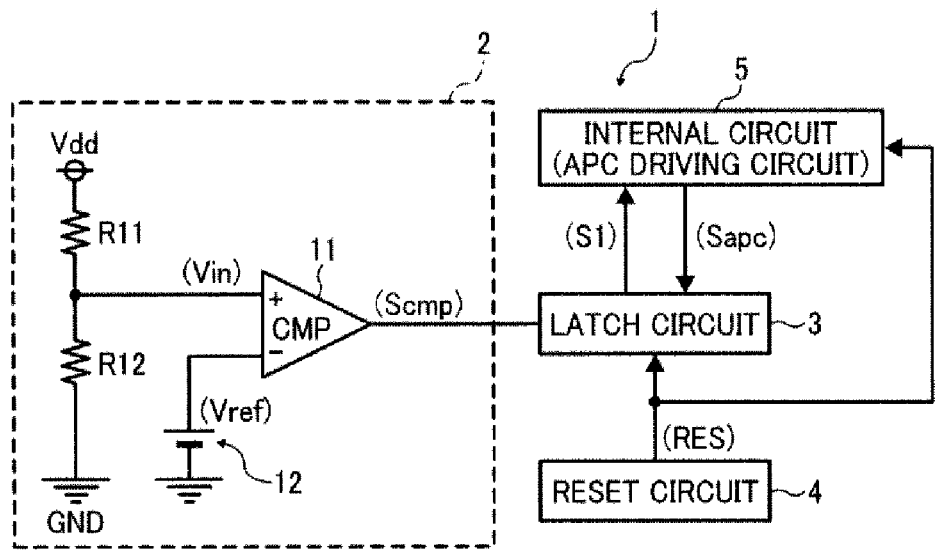
FIG. 11 is a circuit diagram of a semiconductor device which includes an APC drive circuit.

FIG. 11 represents a circuit diagram of a semiconductor device which includes an automatic power control (APC) drive circuit. In FIG. 11, the same elements as those of FIG. 9 are represented with the same symbols.

Figure 12:
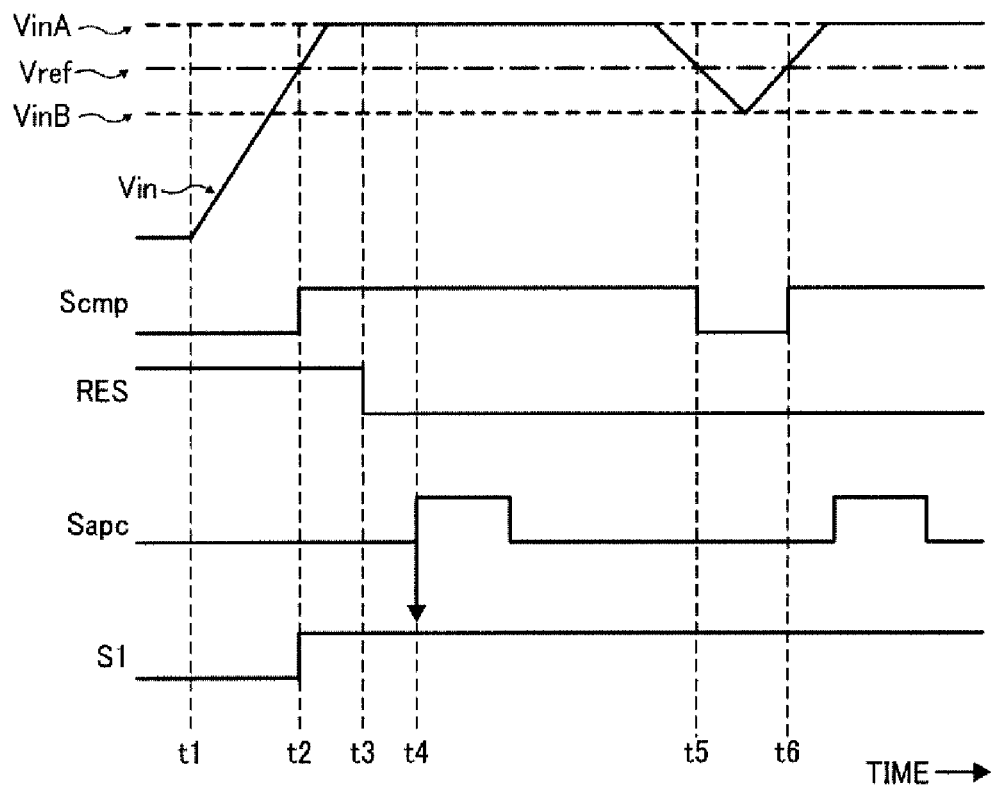
FIG. 12 is a timing chart representing the operation of the semiconductor device of FIG. 11.

The APC drive circuit controls the laser diode, which is a semiconductor laser, to keep an emission amount thereof constant. FIG. 12 is a timing chart representing the operation of the semiconductor device 1 of FIG. 11, and represents an example in which the high voltage VA is input to the power supply terminal Vdd.

In FIG. 12, at time t1, power is applied to the semiconductor 1. Then, while the power supply voltage is increased, the divided voltage Vin is being increased proportional to an increase of the power supply voltage. Further, at time t2, when the divided voltage Vin exceeds the reference voltage Vref, the output signal Scmp is inverted to a high level. Further, at time t3, when a reset signal RES is changed from a high level to a low level, the latch 3 and the internal circuit 5 complete the reset operation. However, at this moment, the latch 3 does not yet store a signal level of the output signal Scomp of the comparator 11 in this circuit.

At the time t4, the APC signal Sapc generated in the internal circuit 5 becomes a high level, the APC drive circuit in the internal circuit 5 starts a first operation. The latch 3 store a signal level of the output signal Scomp of the comparator 11 in response to a change of the APC signal Sapc.

Subsequent operation is similar to that depicted in FIG. 10. More specifically, during a period between the time t5 and the time t6, the signal level of the power supply voltage region signal S1 does not change and keeps a high level even when the output signal Scmp of the comparator 11 becomes a low level. Thus, just before the APC drive circuit in the internal circuit 5 starts a first operation, the power supply voltage input to the semiconductor device 1 is detected and the setting for the internal circuit 5 which includes the APC drive circuit is changed. Accordingly, the setting related to the power supply voltage in the APC drive circuit can be optimized.

In the previous explanation, a case in which the power supply voltage is the high voltage VA is explained. In contrast, in a case in which the low power supply voltage VB is input to the semiconductor device 1 is input, the signal level is reversed. In this case, the signal level of the power supply voltage region signal S1 is a low level.

An example of changing an internal setting for the internal circuit 5 will now be described.

Figure 13:
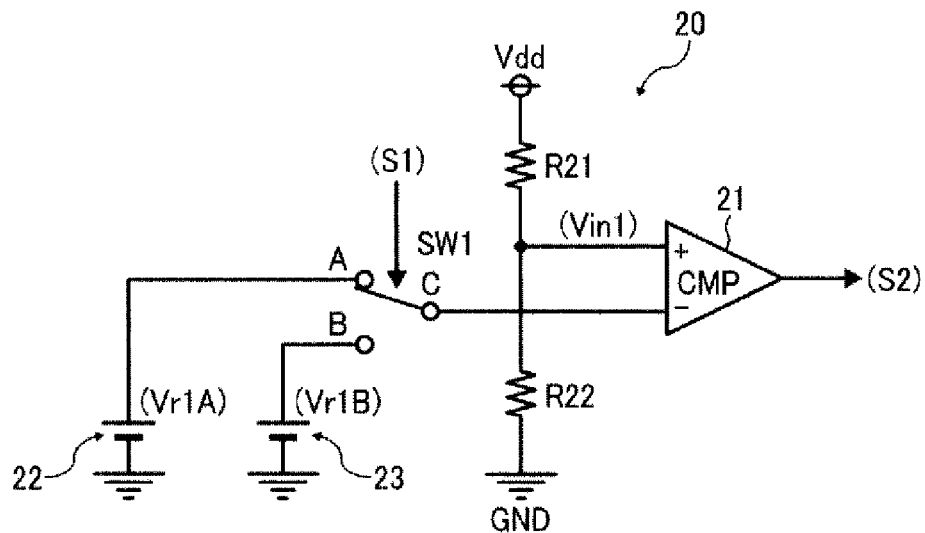
FIG. 13 is a circuit diagram of a semiconductor device which includes a supply voltage drop detection circuit in the internal circuit.

FIG. 13 represents a circuit diagram of a supply voltage drop detection circuit 20 in the internal circuit 5.

In FIG. 13, the supply voltage drop detection circuit 20 determines whether the supply voltage input to the power supply terminal Vdd falls below a predetermined first voltage, and generates and outputs a supply voltage drop detection signal S2 when the supply voltage drop detection circuit 20 detects that the supply voltage falls below a predetermined first voltage.

The supply voltage drop detection circuit 20 includes a comparator 21, a first reference voltage generator 22, a second reference voltage generator 23, a switch SW1, and bleeder resistors R21 and R22. The first reference voltage generator 22 generates a first predetermined reference voltage Vr1A and the second reference voltage generator 23 generates a second predetermined reference voltage Vr1B. The bleeder resistors R21 and R22 are connected in series between the power supply terminal Vdd and ground. A divided voltage Vin1 is output from a junction node between the bleeder resistors R21 and R22. The divided voltage Vin1 is input to a non-inverting input terminal of the comparator 21. An inverting input terminal of the comparator 21 is connected to a common terminal C of the switch SW1. The first reference voltage Vr1A is input to a terminal A of the switch SW1, the second reference voltage Vr1B is input to a terminal B of the switch SW1. The power supply voltage region signal S1 is input to a control terminal of the switch SW1. The switch SW1 connects the common terminal C of the switch to one of the terminal A and the terminal B according to the power supply voltage region signal S1. The first reference voltage Vr1A is set to a minimum voltage that insures operation at the power supply voltage VA, and second reference voltage Vr1B is set to a minimum voltage that insures operation at the power supply voltage VB.

Figure 14:
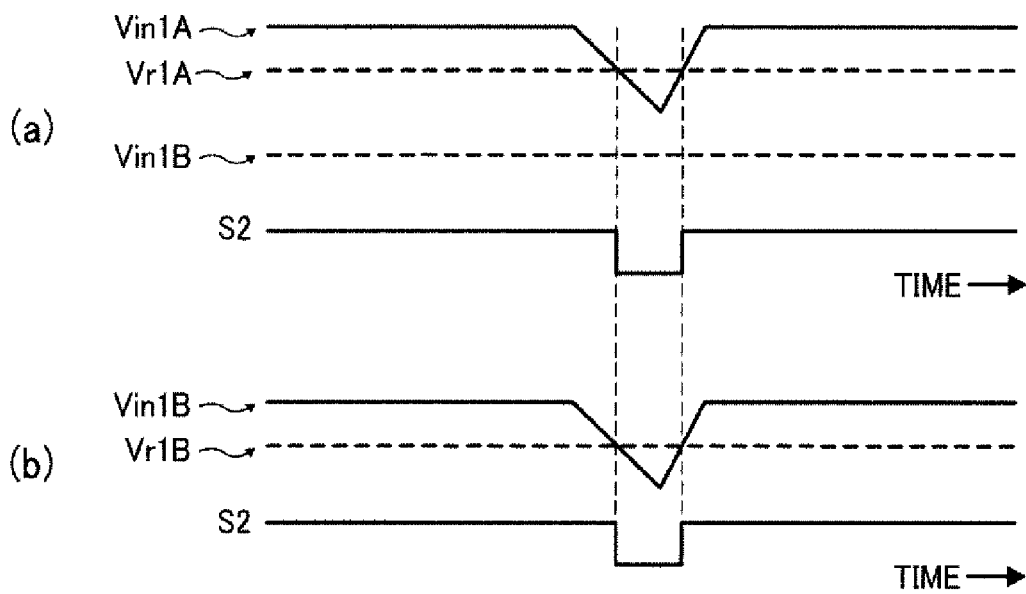
FIG. 14 is a timing chart representing a case in which the supply voltage is input to the power supply terminal

FIG. 14 is timing charts representing an example operation of the supply voltage drop detection circuit 20. An upper portion (a) in FIG. 14 represents a case in which the supply voltage VA is input to the power supply terminal Vdd, and a lower portion (b) in FIG. 14 represents a case in which the supply voltage VB is input to the power supply terminal Vdd. As shown in (a) portion in FIG. 14, when the supply voltage VA is input to the power supply terminal Vdd, the common terminal C of the switch is connected to the terminal A. Accordingly, the first reference voltage Vr1A is input to an inverting terminal of the comparator 21. When the power supply voltage VA is decreased and the divided voltage Vin1 falls below the first reference voltage Vr1A, a signal level of the supply voltage drop detection signal S2 is inverted to a low level.

Further, as shown (b) portion in FIG. 14, when the supply voltage VB is input to the power supply terminal Vdd, the common terminal C of the switch is connected to the terminal B. Accordingly, the second reference voltage Vr1B is input to the inverting terminal of the comparator 21. When the power supply voltage VB is decreased and the divided voltage Vin1 falls below the second reference voltage Vr1B, a signal level of the supply voltage drop detection signal S2 is inverted to a low level.

Thus, it is possible to detect the power supply voltage drop accurately in both voltage regions, VA and VB.

Another example of changing the internal setting for the internal circuit 5 will now be described.

Figure 15:
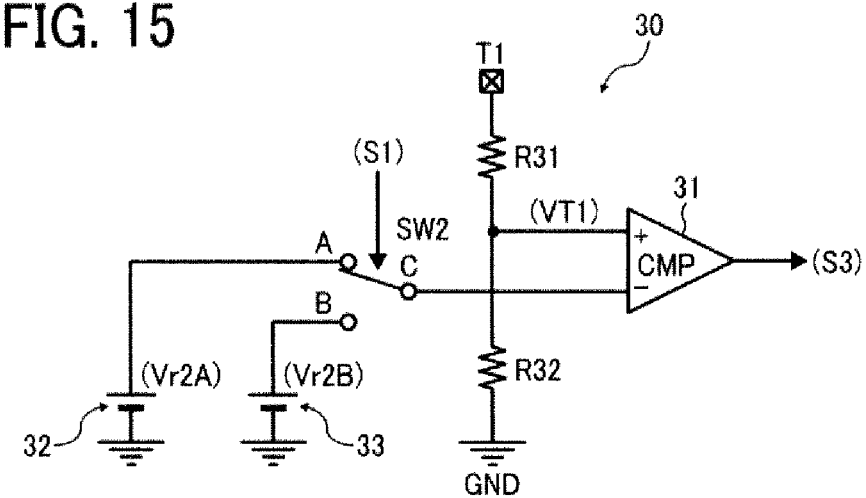
FIG. 15 is a circuit diagram of a semiconductor device which includes a supply voltage drop detection circuit in the internal circuit.

FIG. 15 represents a circuit diagram of a semiconductor device that includes a terminal voltage drop detection circuit 30 in the internal circuit 5. In FIG. 15, the terminal voltage detector 30 determines whether a voltage input to an external terminal T1 of the semiconductor 1 is equal to or higher than a predetermined second voltage.

The terminal voltage detector 30 includes a comparator 31, a third reference voltage generator 32, a fourth reference voltage generator 33, a switch SW2, and bleeder resistors R31 and R32. The third reference voltage generator 32 generates and outputs a third reference voltage Vr2A, and the fourth reference voltage generator 33 generates and outputs a fourth reference voltage Vr2B.

The resistors R31 and R32 are connected in series between the external terminal T1 and ground GND. A divided voltage VT1 is output from a junction node between the bleeder resistors R31 and R32. The divided voltage VT1 is input to a non-inverting terminal of the comparator 31. An inverting terminal of the comparator 31 is connected to the common terminal C of the switch SW2.

The third reference voltage Vr2A is input to a terminal A of the switch SW2, and the fourth reference voltage Vr2B is input to a terminal B of the switch SW2. The power supply voltage region signal S1 is input to a control input terminal of the switch SW2. The switch SW2 connects the terminal C to one of the terminal A and the terminal B according to the power supply voltage region signal S1.

The third reference voltage Vr2A is set to a voltage equal to the divided voltage VT1 generated by dividing the maximum voltage which can be input to the external terminal T1 when the power supply voltage VA is input to the power supply terminal Vdd.

The fourth reference voltage Vr2B is set to a voltage equal to the divided voltage VT1 generated by dividing maximum voltage which can be input to the external terminal T1 when the power supply voltage VB is input to the power supply terminal Vdd.

Figure 16:
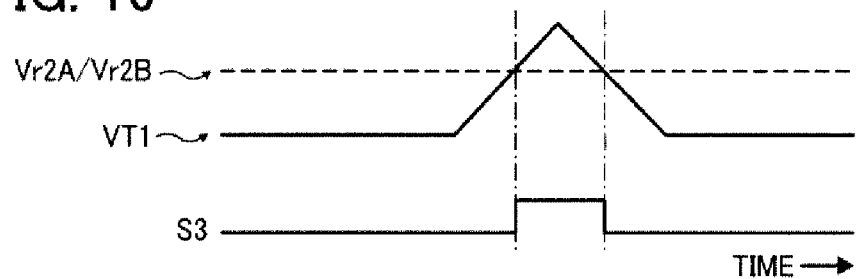
FIG. 16 is a timing chart representing the operation of the terminal voltage detector.

FIG. 16 is a timing chart representing the operation of the terminal voltage detector 30. Referring to FIG. 16, the operation of the terminal voltage detector 30 will be explained. FIG. 16 represents a case in which high voltage is input to the power supply terminal Vdd.

When the power supply voltage VA is input to the power supply terminal Vdd, the common terminal C of the switch SW2 is connected to the terminal A of the switch SW2. Accordingly, the third reference voltage Vr2A is input to the inverting input terminal of the comparator 31. When the voltage input to the external terminal T1 is increased and the divided voltage VT1 exceeds the third reference voltage Vr2A, a terminal voltage detection signal S3, that is an output signal of the comparator 31, is inverted to a high level.

Similarly, when the power supply voltage VB is input to the power supply terminal Vdd, the common terminal C of the switch SW2 is connected to the terminal B of the switch SW2. Accordingly, the fourth reference voltage Vr2B is input to the inverting input terminal of the comparator 31. When the voltage input to the external terminal T1 is increased and the divided voltage VT1 exceeds the fourth reference voltage Vr2B, a terminal voltage detection signal S3, that is an output signal of the comparator 31, is inverted to a high level.

As described above, it is possible to use the third reference voltage Vr2A and the fourth reference voltage Vr2B by switching between them. Thus, even when any power supply voltage VA or VB is input to the power supply terminal Vdd, it is possible to detect an abnormality in the voltage of the external terminal T1 accurately.

Yet another example of changing the internal condition setting for the internal circuit 5 will now be described.

Figure 17:
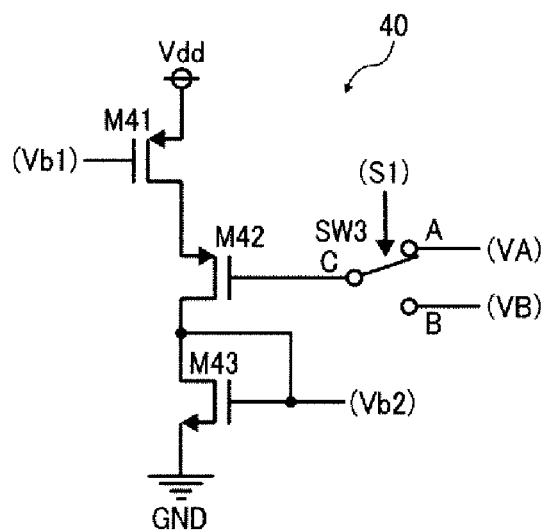
FIG. 17 is a circuit diagram of a bias circuit.

FIG. 17 represents a circuit diagram of a bias circuit 40 provided in the internal circuit 5. The bias circuit 40 is used in, for example, an amplifier provided in APC drive circuit. In FIG. 17, the bias circuit 40 includes PMOS transistors M41 and M42, an NMOS transistor M43, and switch SW3. The switch SW3 is controlled by the power supply voltage region signal S1. The PMOS transistors M41 and M42, and the NMOS transistor M43, are connected in series between power supply terminal Vdd and ground GND.

A bias voltage Vb1 is input to a gate of the PMOS transistor M41. A bias voltage Vb2 is input to a gate of the NMOS transistor M43, and the gate of the NMOS transistor M43 is connected to the drain of the NMOS transistor M43. The PMOS transistor M42 eliminates a fluctuation of the drain voltage of the PMOS transistor M41 due to a fluctuation of the supply voltage input to the power supply terminal Vdd. The gate of the PMOS transistor M42 is connected to common terminal C of the switch SW3. The bias voltage VA is input to a terminal A of the switch SW3, and the bias voltage VB is input to a terminal B of the switch SW3. The power supply voltage region signal S1 is input to a control terminal of the switch SW3.

When the power supply voltage VA is input to the power supply terminal Vdd, the common terminal C of the switch SW3 is connected to the terminal A of the switch SW3, and the power supply voltage VA is input to the gate of the PMOS transistor M42.

Further, when the power supply voltage VB is input to the power supply terminal Vdd, the common terminal C of the switch SW3 is connected to the terminal B of the switch SW3, and the power supply voltage VB is input to the gate of the PMOS transistor M42. Consequently, the bias circuit 40 can operate with the best bias condition at any power supply voltage region.

Another example of changing the internal condition setting for the internal circuit 5 will now be explained.

Figure 18:
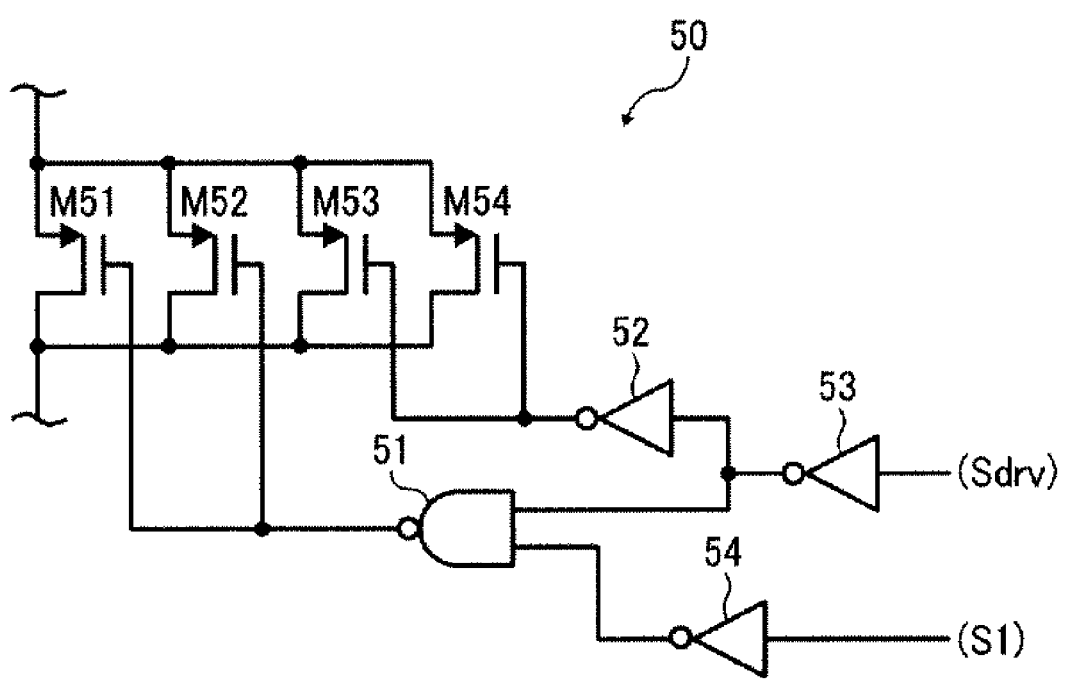
FIG. 18 is a circuit diagram of a switching circuit provided in the internal circuit.

FIG. 18 represents a circuit diagram of a switching circuit 50 provided in the internal circuit 5. The switching circuit 50 includes switching transistors and a drive circuit. The drive circuit includes a NAND circuit 51 and inverters 52, 53, and 54. In FIG. 18, switching transistors M51, M52, M53, and M54 are connected in parallel. Each gate of the PMOS transistors M51 and M52 is commonly connected and a connection node is connected to an output terminal of the NAND circuit 51. Further, each gate of the PMOS transistors M53 and M54 is commonly connected and a connection node is connected to an output terminal of the inverter 52.

A drive signal Sdrv is input to an input terminal of the inverter 53 to control the switching transistors. An output terminal of the inverter 53 is connected to an input terminal of the inverter 52 and a first input terminal of the NAND circuit 51. A second input terminal of the NAND circuit 51 is connected to an output terminal of the inverter 54. The power supply voltage region signal S1 is input to an input terminal of the inverter 54.

In this circuit configuration, when the supply voltage VB, that is, a low voltage region, is input to the power supply terminal Vdd, the power supply voltage region signal S1 is a low level, the second input terminal of the NAND circuit 51 becomes a high level.

Accordingly, a signal level of the output terminal of the NAND circuit 51 is determined by a signal input to the first input terminal of the NAND circuit 51. More specifically, when the drive signal Sdrv is a low level, an output of the inverter 52 and an output of the NAND circuit 51 become both low to turn the PMOS transistors M51, M52, M53, and M54 on. Further, when the drive signal Sdrv is a high level, an output of the inverter 52 and an output of the AND circuit 51 become both high to turn the PMOS transistors M51, M52, M53, and M54 off. Thus, when the power supply voltage VB is used, all the transistors that form the switching transistor turn on and off at the same time. Consequently, it is possible to obtain sufficient switching performance even when the power supply voltage is a low voltage region.

In contrast, when the supply voltage VA that is a high voltage region is input to the power supply terminal Vdd, the power supply voltage region signal S1 is a high level. Accordingly, the second input terminal of the NAND circuit 51 is a low level, and an output of the NAND circuit 51 is a high level. The PMOS transistors M51 and M52 are turned off independently of the drive signal Sdrv. More specifically, when the supply voltage VA is used, only two transistors M53 and M54 contribute to the switching operation. Accordingly, parasitic capacitance of the switching transistor is halved, resulting in reduction of noise of switching transistors.

Further, when the supply voltage is a high voltage region, it is possible to obtain sufficient switching performance of the switching transistor because the drive voltage is large even with fewer transistors which perform switching operation.

In FIG. 18, four transistors form the switching transistor. However, this is just an example and the number of transistors is not limited to four, as any plural number of transistors may be employed.

Further, in FIG. 18, the inverter 54 and the NAND 51 is used. However, a buffer may be used in place of the inverter 54, and an OR circuit may be used in place of the NAND circuit 51, respectively.

Further, the number of transistors to be turned off is not limited to half the total number of the transistors. However, an appropriate number of the transistors may be employed for the given supply power voltage region.

In the previous description, two supply power voltage regions are applied to the example system. However, similar configurations may be employed for a case in which more than two supply power voltage regions are applied.

Numerous additional modifications and variations are possible in light of the above teachings. It is therefore to be understood that, within the scope of the appended claims, the disclosure of this patent specification may be practiced otherwise than as specifically described herein.

This patent specification is based on Japanese Patent Application No. 2009-209486 filed on Sep. 10, 2009 in the Japanese Patent Office, the entire contents of which are incorporated by reference herein.

What is claimed is:

1. A semiconductor device, comprising:
   an internal circuit configured to perform a predetermined function at a plurality of different supply power voltages;
   a power supply voltage region detector configured to detect a supply power voltage to output a detection signal;
   a latch configured to store the signal output from the power supply voltage region detector and output the stored signal as a power supply voltage region signal; and
   a reset circuit configured to generate a reset signal to cause the internal circuit to perform a predetermined reset operation when power is applied to the semiconductor device,
   wherein the latch stores the output signal from the power supply voltage region detector immediately after the reset operation for the internal circuit is released, and the internal circuit changes an internal setting according to the power supply voltage region signal output from the latch, and
   wherein the internal circuit includes an APC drive circuit that controls driving of the laser diode.

2. The semiconductor device of claim 1, wherein the internal circuit includes a voltage drop detector that detects whether an input power supply voltage drops below a predetermined first voltage by comparing the input power supply voltage with a reference voltage, and outputs a voltage drop detection signal when the supply voltage drops below the first voltage, and wherein the voltage drop detector changes the reference voltage that sets the predetermined first voltage according to the power supply voltage region signal.

3. The semiconductor device of claim 1, wherein the internal circuit includes a terminal voltage detector that detects whether a voltage input to an external terminal exceeds a predetermined second voltage by comparing the input voltage with a reference voltage and outputs a terminal voltage detection signal when the voltage exceeds a predetermined second voltage, and wherein the terminal voltage detector changes the reference voltage that sets the second reference voltage according to the power supply voltage region signal.

4. The semiconductor device of claim 1, wherein the internal circuit includes a bias circuit that generates and outputs a bias voltage, and wherein the bias circuit changes the bias voltage according to the power supply voltage region signal.

5. The semiconductor device of claim 1, wherein the internal circuit includes a switching transistor and a switching circuit that drives the switching transistor, and wherein the switching circuit changed the supply current capacity according to the power supply voltage region signal.

6. The semiconductor device of claim 5, wherein the switching transistor is formed of a plurality of transistors connected in parallel with each other, and the switching circuit can make each transistor off independently of a drive signal from the drive circuit.

7. A semiconductor device, comprising:
   an internal circuit that includes an APC drive circuit that controls driving of a laser diode;
   a power supply voltage region detector configured to detect a supply power voltage to output a detection signal;
   a latch configured to store the output signal from the power supply voltage region detector and output the stored signal as a power supply voltage region signal; and
   a reset circuit configured to generate a reset signal to cause the internal circuit to perform a predetermined reset operation when power is applied to the semiconductor device,
   wherein the latch stores the signal output from the power supply voltage region detector by the first APC signal after power-on which causes the APC drive circuit to operate, and the internal circuit changes an internal setting according to the power supply voltage region signal output from the latch.

8. The semiconductor device of claim 7, wherein the APC drive circuit changes an internal setting according to the power supply voltage region signal output from the latch.

9. The semiconductor device of claim 8, wherein the APC drive circuit that includes a bias circuit which generates and outputs a bias voltage, and wherein the bias circuit changes the bias voltage according to the power supply voltage region signal.

10. The semiconductor device of claim 8, wherein the APC drive circuit includes a switching transistor and a switching circuit that drives the switching transistor, and wherein the switching circuit changes the supply current capacity according to the power supply voltage region signal.

* * * * *